US006191723B1

United States Patent
Lewis

(10) Patent No.: US 6,191,723 B1
(45) Date of Patent: Feb. 20, 2001

(54) FAST CAPACITANCE MEASUREMENT

(75) Inventor: Jason D. Lewis, Everett, WA (US)

(73) Assignee: Fluke Corporation, Everett, WA (US)

(*) Notice: Under 35 U.S.C. 154(b), the term of this patent shall be extended for 0 days.

(21) Appl. No.: 09/359,991

(22) Filed: Jul. 22, 1999

(51) Int. Cl.[7] .................................................... H03M 1/50
(52) U.S. Cl. .......................... 341/166; 324/678; 324/677
(58) Field of Search .................................. 324/519, 520, 324/658, 667, 678, 548, 677; 341/166

(56) References Cited

U.S. PATENT DOCUMENTS

| 4,853,719 | * | 8/1989 | ElHatem et al. ...................... 346/140 |
| 5,073,757 | | 12/1991 | George . |
| 5,136,251 | | 8/1992 | George et al. . |
| 5,146,412 | * | 9/1992 | Jones ..................................... 324/678 |
| 5,450,014 | * | 9/1995 | Lee ....................................... 324/548 |
| 5,646,539 | * | 7/1997 | Codina et al. ......................... 324/678 |
| 5,694,051 | * | 12/1997 | Ueyama et al. ....................... 324/768 |

OTHER PUBLICATIONS

Irwin (Basic Engineering Circuit Analysis, 1987, Macmillan Publishing Co. pp216, 247–248).*

* cited by examiner

Primary Examiner—Michael Tokar
Assistant Examiner—Steven S. Paik
(74) Attorney, Agent, or Firm—George T. Noe

(57) ABSTRACT

A method of measuring capacitance is provided in which measurement speed is increased by as much as two orders of magnitude by optimizing timing parameters to rapidly charge and discharge the capacitor in small increments about an equilibrium voltage. The capacitor is charged at a linear rate by applying a predetermined constant current thereto, and discharged at an exponential rate determined by the RC time constant in the discharge path. Incremental charge and discharge times are selected in such a manner that results in an equilibrium voltage at a point where the charge voltage ramp and discharge voltage curve would cross if they were superimposed on one another. By appropriate selection of the incremental charge and discharge times, the equilibrium voltage may be conveniently established at a point well within the range of a measuring analog-to-digital converter (ADC). The voltage difference over the incremental charge time may be measured on one cycle and utilized to compute the capacitance value.

2 Claims, 5 Drawing Sheets

Measurement Voltage vs. Capacitance (100uF - 50000uF)
*i = 100uA; tc = 0.667s; td = 1.375s; R = 5 Kohms*

| CMax | CLowLim | CMinOpt | Vmax | Resolution | Digits | ΔVmin | IREF | Tc | TdMin | TdOpt |
|---|---|---|---|---|---|---|---|---|---|---|
| 50,000 uF | 50 uF | 55 uF | 1V | 10 uV | 2 | 1 mV | 100 uA | 500 mS | 250 mS | 660 mS |
| 1,000 uF | 10 uF | 11 uF | 1V | 10 uV | 3 | 10 mV | 100 uA | 100 mS | 50.3 mS | 130 mS |
| 100 uF | 1 uF | 1.1 uF | 1V | 10 uV | 3 | 10 mV | 10 uA | 100 mS | 5.03 mS | 13 mS |
| 10 uF | 100 nF | 110 nF | 3V | 30 uV | 3 | 30 mV | 10 uA | 30 mS | 0.503 mS | 1.3 mS |

*Fig. 8*

FAST CAPACITANCE MEASUREMENT

BACKGROUND OF THE INVENTION

This invention relates generally to measurement of capacitance, and in particular to a method of optimizing timing parameters to provide fast capacitance measurement.

Capacitance measurement has become an important feature of measuring instruments such as digital multimeters. U.S. Pat. Nos. 5,073,757 and 5,136,251, both of which are assigned to Fluke Corporation, disclose methods of measuring small and large capacitances in which an unknown capacitor was allowed to fully charge to a reference voltage at its RC rate, while at the same time a current proportional to the charging current was accumulated on the storage capacitor of a dual-slope integrating analog-to-digital converter (ADC). Small capacitances could fully charge in one integrate cycle of the ADC, while large capacitances required several integrate cycles to fully charge. In both cases, the proportional charge stored on the integrating ADC's storage capacitor was removed during "de-integrate" cycles over periods of time dictated by the amount of stored charge, and the time was measured to give an indication of capacitance value.

Not only were these prior art capacitance measurement techniques unsatisfactory due to inordinately long measurement times because of the wait for the unknown capacitor to charge fully, but they were incompatible with the timing and mechanics of multislope integrating ADCs that began to supplant dual-slope integrating ADCs.

Multislope ADCs, an example of which is disclosed in U.S. Pat. No. 5,321,403, assigned to Fluke Corporation, exhibit faster and more accurate measurements than the dual-slope ADCs. That is, rather than the single-slope integrate cycle of a dual-slope ADC, multi-slope ADCs add and remove known amounts of charge during the integrate cycle to keep the final stored charge at a relatively low value. This of course results in a substantially reduced "de-integrate cycle" in which the final quantity is measured very quickly and algebraically summed with the known added or subtracted charges.

The foregoing difficulties were overcome by the improved capacitance measurement system disclosed in corresponding U.S. patent application Ser. No. 09/267,504, filed Mar. 12, 1999, wherein the improvement included use of a constant current source to generate a linear ramp voltage across the capacitor being measured. Both measurement speed and accuracy were improved for a wide range of capacitors; however, for large capacitors in particular, long time periods, e.g., up to several minutes for an incompletely discharged 50,000 $\mu$F capacitor, were still required to accurately determine the capacitance value.

SUMMARY OF THE INVENTION

In accordance with the present invention, a method of measuring capacitances is provided in which measurement speed is increased by optimizing timing parameters to rapidly charge and discharge the capacitor in small increments about an equilibrium voltage.

The capacitor is charged at a linear rate by applying a predetermined constant current thereto, and discharged at an exponential rate determined by the RC time constant in the discharge path. Incremental charge and discharge times are selected in such a manner that results in an equilibrium voltage at a point where the charge voltage ramp and discharge voltage curve would cross if they were superimposed on one another. By appropriate selection of the incremental charge and discharge times, the equilibrium voltage, and hence, the voltage charge ramp, may be conveniently established at a point within the range of a measuring analog-to-digital converter (ADC).

The voltage difference over the incremental charge time may be measured on one cycle and utilized to compute the capacitance value.

In an embodiment built and tested in accordance with the method of the present invention, a 50,000 $\mu$F capacitor was measured in under 2.5 seconds, which is about an order of magnitude faster than was previously attainable.

It is therefore one object of the present invention to provide a method for fast capacitance measurement.

It is another object of the present invention to provide a method for fast capacitance measurement in which existing measurement systems may be used.

It is a further object of the present invention to provide a method for fast capacitance measurement in which timing parameters are optimized by selecting incremental charge and discharge time intervals.

Other objects, features, and advantages of the present invention will become obvious to those having ordinary skill in the art upon a reading of the following description when taken in conjunction with the accompanying drawings.

BRIEF DESCRIPTION OF THE DRAWINGS

FIG. 8 shows a table of typical values for fast measurement of a wide range of capacitance values.

DETAILED DESCRIPTION OF THE INVENTION

Figure 1:
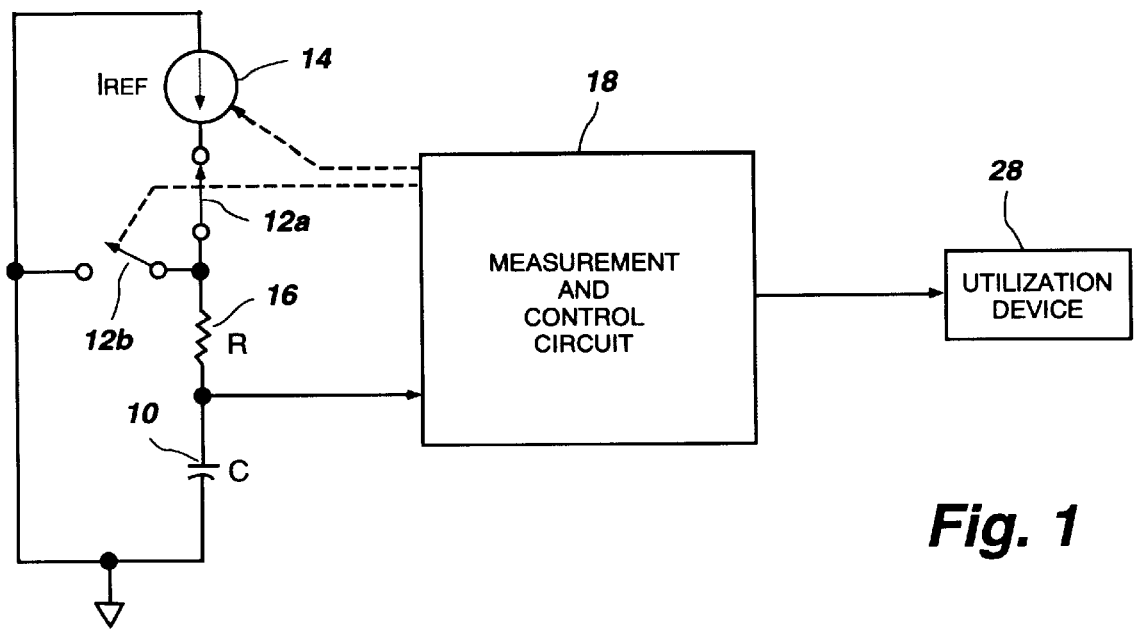
FIG. 1 is a schematic diagram of a capacitance measurement system.

FIG. 1 is a schematic diagram of a capacitance measurement system for measuring the capacitance value of a capacitor 10. When switch 12a is closed (and switch 12b open), a constant current source 14 is connected in series with a capacitor 10 to charge the capacitor. When switch 12a is open (and switch 12b closed), capacitor 10 discharges. During the time that the capacitor 10 charges, a linear voltage ramp is produced because of the constant current delivered to the capacitor. Capacitance measurement is taken from the linear ramp where a change in voltage $\Delta V$ is directly proportional to a change in time $\Delta t$. Since the value of capacitance C is equal to the amount of charge Q on the capacitor divided by voltage across the capacitor, or C=Q/V, and Q=it, then C=$I_{REF}\Delta t/\Delta V$, where $I_{REF}$ is the value of constant current delivered by constant current source 14.

A resistor 16 provides input protection for a measurement and control circuit 18, which controls the operation of switches 12a and 12b, as well as receives and measures the voltage on capacitor 10 and calculates the capacitance value. A utilization device 28, which may suitably be a display device or an internal memory device, is coupled to the measurement and control circuit 18 to provide a visual display or storage of the calculated capacitance value. The measurement and control circuit 18 may suitably include an analog-to-digital converter (ADC) and a processor. In the preferred embodiment for carrying out the method of the present invention, the ADC is a multislope integrating ADC with an internal state machine to control operation of the ADC throughout its integrate and "de-integrate" cycles, as is well known in the art. A measurement system such as that of FIG. 1 is shown and fully described in corresponding U.S. application Ser. No. 09/267,504, filed Mar. 12, 1999.

Figure 2:
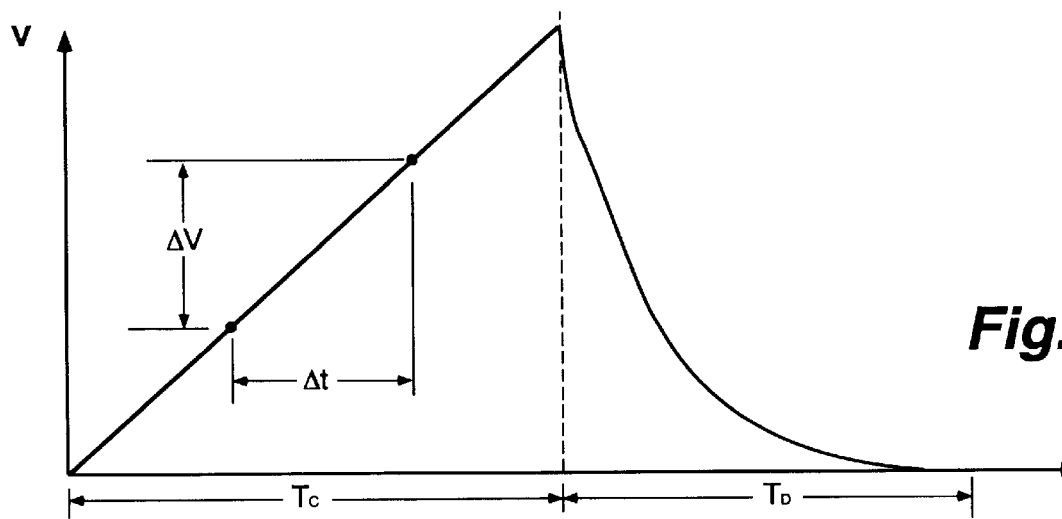
FIG. 2 shows linear charge and exponential discharge waveforms of a capacitor.

FIG. 2 shows the charge and discharge voltage waveforms of a very small capacitor 10 during operation in order to understand the concepts that will be discussed below in dealing with large capacitors. When measurement and control circuit 18 closes switch 12a (and opens switch 12b) in response to a command from a user to determine a capacitance value, constant current source 14 delivers a predetermined constant current to capacitor 10, causing capacitor 10 to charge linearly over a period of time $T_C$. It is from this linear ramp that the aforementioned values of $\Delta V$ and $\Delta t$ are taken to calculate the capacitance value.

The general equation describing the linear rate of charge of capacitor 10 is as follows:

$$dv/dt = i/C, \qquad (1)$$

where i is the value of constant current and C is the capacitance value. For consistency of explanation, $i=I_{REF}$ delivered by constant current source 14.

When measurement and control circuit 18 opens switch 12a (and closes switch 12b, capacitor 10 discharges through closed switch 12b and resistor 16 over a period $T_D$ at an exponential rate determined by the capacitance value of capacitor 10 and any resistance R in the discharge path, including that of protection resistor 16.

The general equation describing the exponential rate of discharge of capacitor 10 is as follows:

$$dv/dt = -(1/RC)V_0 e^{-t/RC}, \qquad (2)$$

where $V_0$ is the voltage across the capacitor at the moment switch 12b is closed.

From the foregoing, it can be discerned that the rate of charge is directly proportional to the level of constant current $I_{REF}$ and inversely proportional to the value of capacitance. That is, the rate of charge, which is indicated by the angle of the slope of the linear ramp, increases if the current increases or if the capacitance value decreases. Likewise, the rate of charge decreases if the current decreases or if the capacitance value increases. Also, the rate of discharge varies with the RC time constant.

Figure 3:
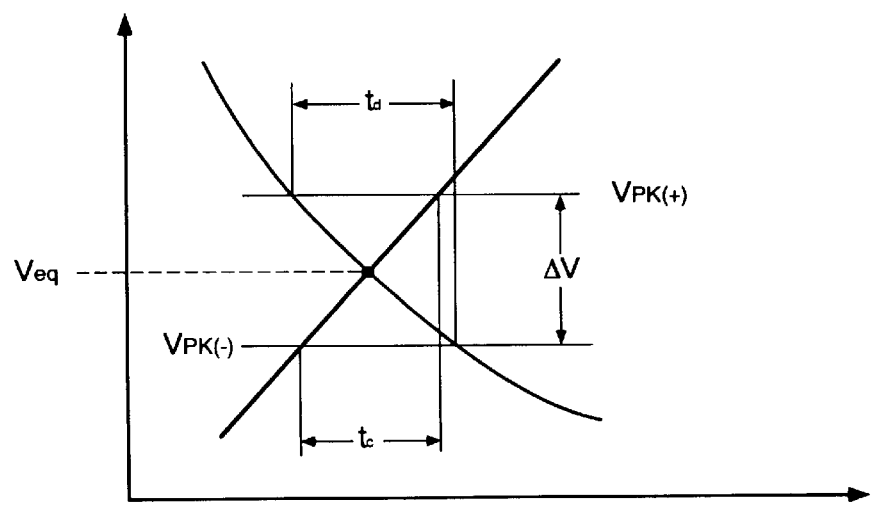
FIG. 3 shows partial linear charge and exponential discharge waveforms superimposed on one another to aid in understanding the principles of the present invention.

For purposes of illustration, FIG. 3 shows partial charge and discharge waveforms superimposed on one another so that it can be seen that under certain circumstances there is an equilibrium voltage point $V_{eq}$ where the charging voltage is equal to the discharging voltage. Taking this a step further, it can be seen in FIG. 3 that near the voltage $V_{eq}$ the incremental positive-going voltage transition $\Delta V$ during an incremental charge interval $t_c$ will be exactly the opposite of an incremental negative-going voltage transition $\Delta V$ during an incremental discharge interval $t_d$. That is, the incremental voltage transitions $\Delta V$ will be equal. However, it should be noted that at any point above or below the equilibrium voltage, the voltage swing during a charge interval is not equal to the voltage swing during a discharge interval. Note also that $t_c \neq t_d$ because of the non-linearity of the discharge curve. By multiplying equation (1) by $t_c$ and equation (2) by $t_d$, and setting the two results equal to each other, the following is obtained:

$$(i/C)t_c = -[-(1/RC)V_0 e^{-t_d/RC}]t_d. \qquad (3)$$

This forces the voltage swings to be equal at the point of interest. If the voltage transition $\Delta V$ is small, then $V_0$ can approximated by $V_{eq}$. By substituting $V_{eq}$ for $V_0$ in equation (3) and solving for $V_{eq}$, the following is obtained:

$$V_{eq} \approx iRe^{t_d/RC}(t_c/t_d). \qquad (4)$$

Again, the charge and discharge waveforms in FIG. 3 are optimized to illustrate a point; however, it will become apparent that by choosing appropriate values of $I_{REF}$ and incremental time intervals $t_c$ and $t_d$, as will be explained below, the principles hold true for measurement of a wide range of capacitance values.

Figure 4:
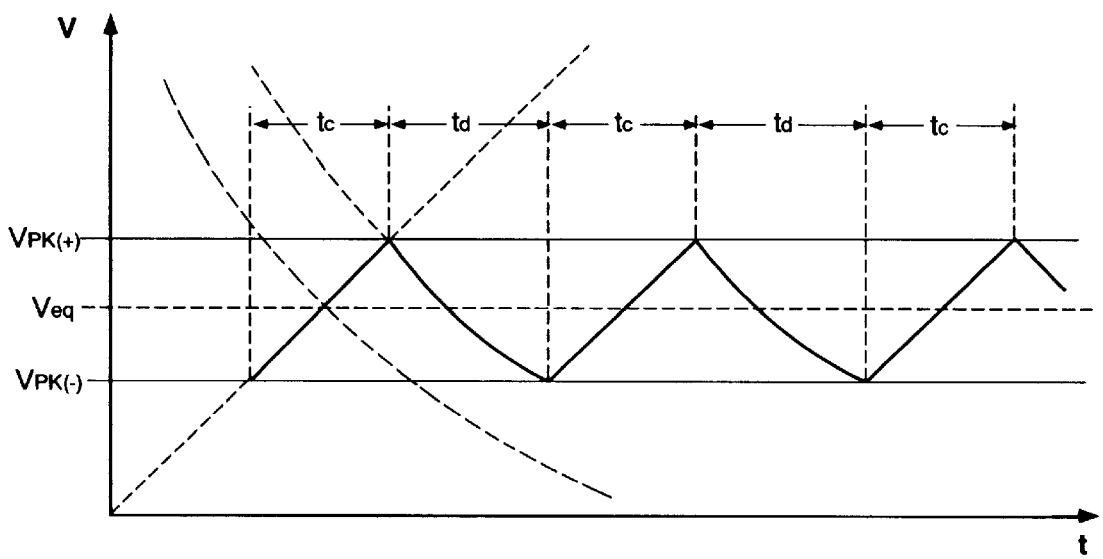
FIG. 4 shows several cycles of charge and discharge waveforms centered around an equilibrium voltage.
Figure 5:
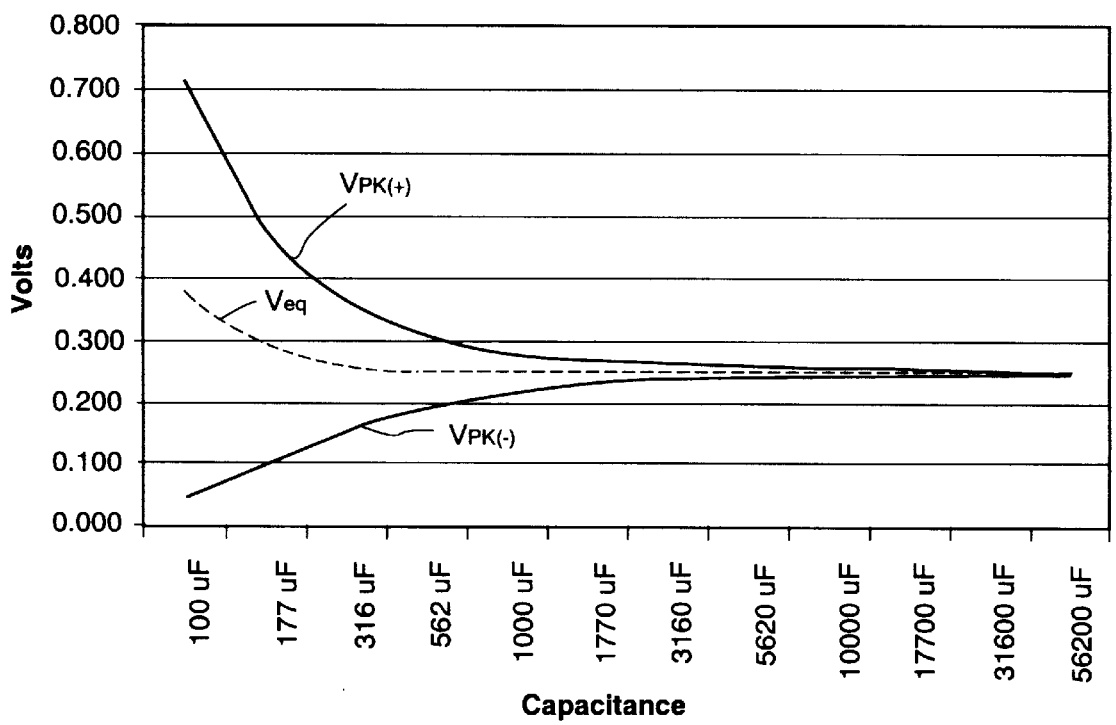
FIGS. 5, 6, and 7 show graphs plotted for $V_{eq}$, $V_{PK(+)}$, and $V_{PK(-)}$ for different capacitance ranges.
Figure 6:
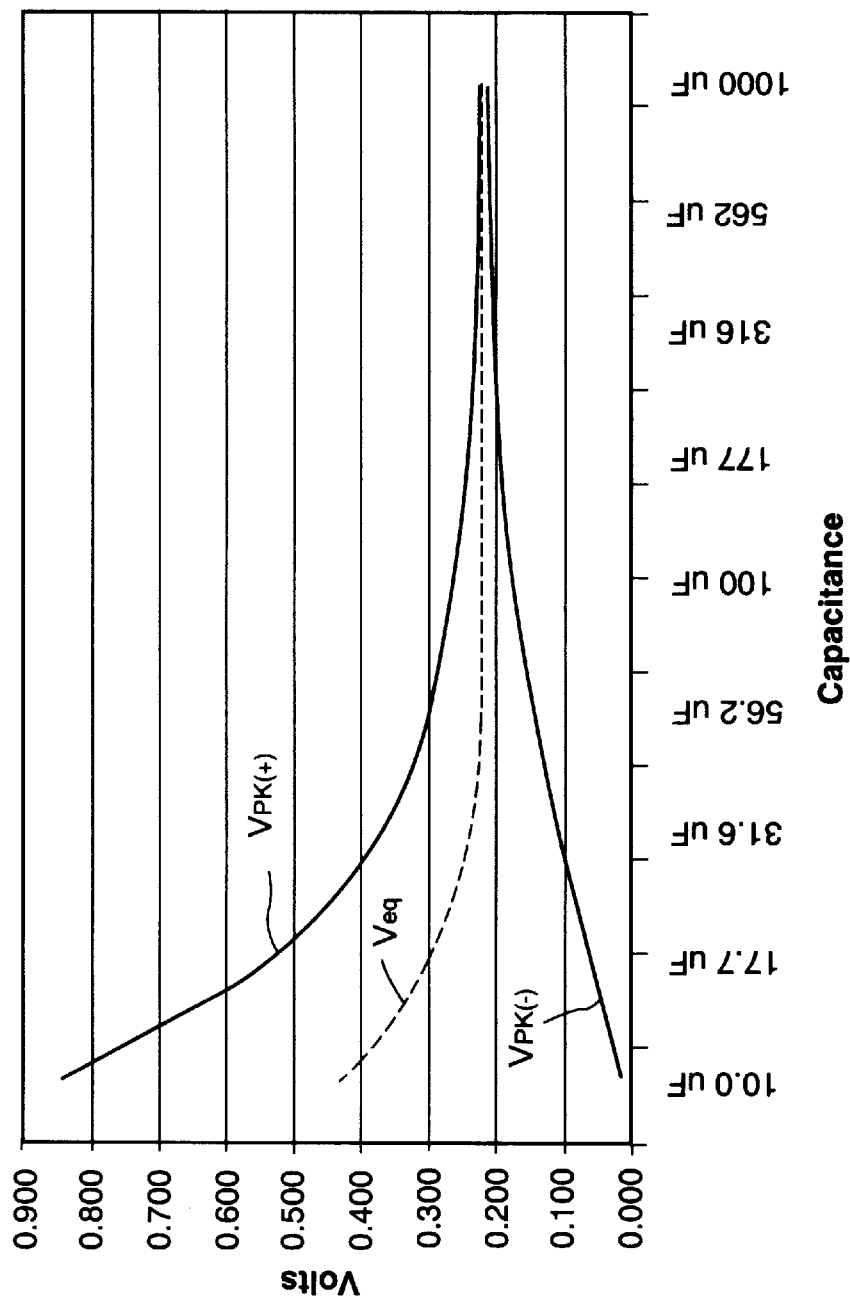
Figure 7:
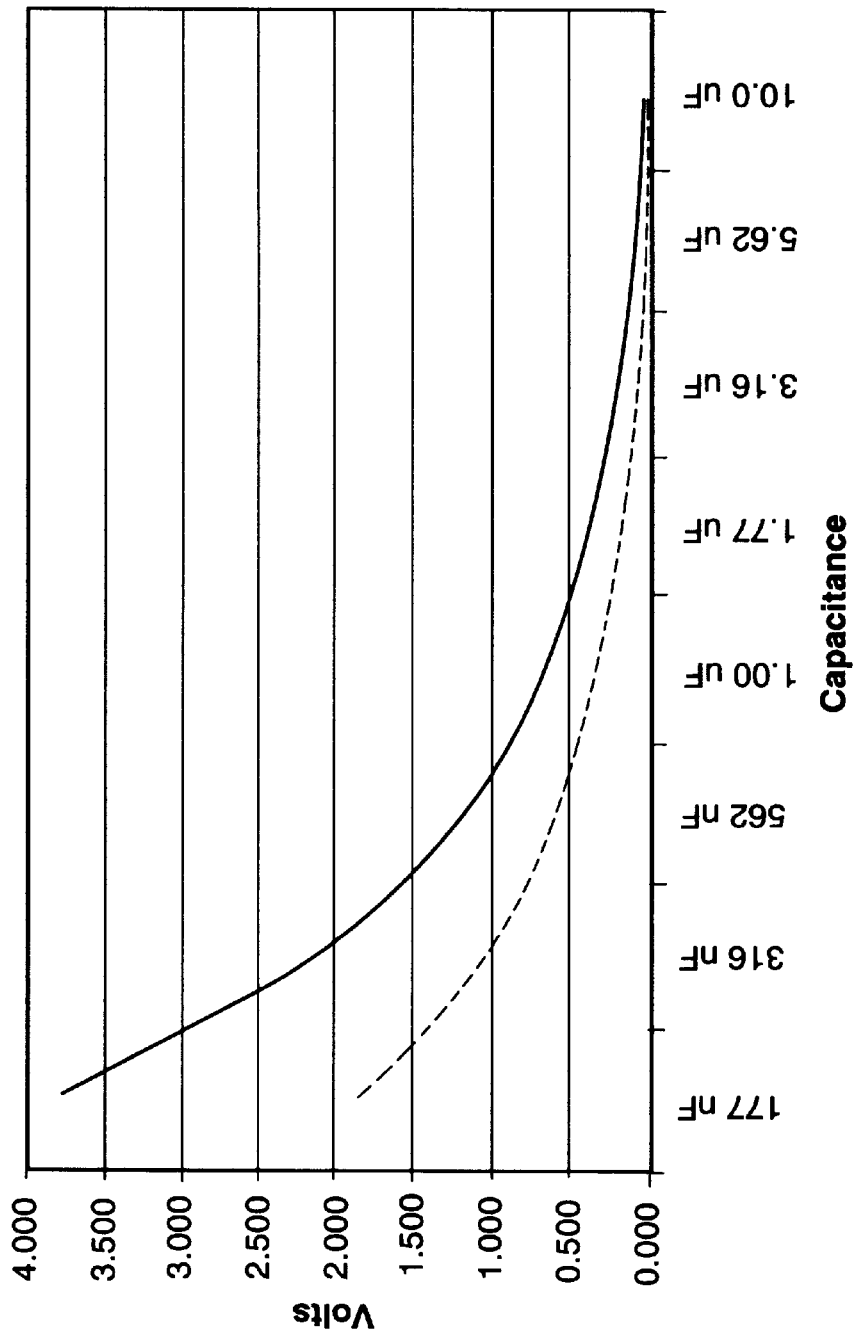

FIG. 4 shows several charge and discharge cycles of a waveform centered around an equilibrium voltage $V_{eq}$ during the measurement of a large capacitor. By choosing incremental time intervals $t_c$ and $t_d$ in the right proportion, the value of equilibrium voltage $V_{eq}$ can be set at a conveniently low level for the case of a large capacitor. The waveform of FIG. 4 shows that after a charge interval $t_c$, a high peak voltage $V_{PK(+)}$ is reached, and after a discharge interval $t_d$, a low peak voltage $V_{PK(-)}$ is reached. For optimum measurement resolution, it is preferable that this waveform fit within and closely match the input range, or input window, of an analog-to-digital converter, such as the ADC in the aforementioned measurement and control circuit 18 of FIG. 1. However, it can be seen from the graphs plotted for $V_{eq}$, $V_{PK(+)}$, and $V_{PK(-)}$ shown in FIGS. 5 through 7 for different capacitance ranges, with other parameters such as $I_{REF}$, $t_c$, $t_d$, and R held constant, that these values vary with the size of the capacitor being measured.

Note that for very large capacitors where $t_d/RC$ approaches zero, the expression $e^{t_d/RC}$ in equation (4) is very nearly equal to one (because $e^0=1$). Thus, for very large capacitors, the equilibrium voltage $V_{eq}$ depends very little on the value of the capacitor. Instead, equilibrium voltage $V_{eq}$ depends primarily on the amount of current $I_{REF}$, the value R of the protection resistor (resistor 16 in FIG. 1, which is about five kilohms in the commercial embodiment), and the ratio of charge time to discharge time, or $t_c/t_d$. Again, this approximation holds for very large capacitors and the assumption is made that the incremental time intervals $t_c$ and $t_d$ are very small compared with the RC time constant.

The selection of incremental time intervals $t_c$ and $t_d$ can be made only after considering their impact on the measurement of large capacitors as well as small capacitors.

For the case of a small capacitor, equation (4) is no longer valid because $V_0 \neq V_{eq}$, and the RC time constant is no longer very large compared with the incremental discharge time $t_d$. That is, $RC \ll t_d$ for a small capacitor. The value of $V_{eq}$ actually increases without bound as the capacitance decreases, and so consequently, the high peak voltage $V_{PK(+)}$ also increases without bound. These phenomena can be seen in FIGS. 5 through 7. Since it is important for the high peak voltage $V_{PK(+)}$ to remain within the measurement range of the ADC, we must use a more general method for defining the charge and discharge times, $t_c$ and $t_d$, respectively, for the measurement of large and small capacitors alike.

In the example that follows, charge time $t_c$ will be chosen first, and then $t_d$ will be determined. For the purpose of selecting $t_c$, assume $t_d = \infty$. Select the value of the largest capacitor that will be measured for a given measurement range, and let this value be $C_{max}$. In our practical example, assume that $C_{max}$=50,000 µF. The ADC resolution will dictate the smallest useful peak-to-peak voltage swing, which will be denoted as $\Delta V_{min}$. For this example, let $\Delta V_{min}$=1 mV. (NOTE: If the ADC provides 10 µV resolution, this will yield a two-digit result when 1 mV≦ΔV<10 mV, three digits for 10 mV≦ΔV<100 mV, and four digits for 100 mV≦ΔV<1V.) The charge current $I_{REF}$ will be arbitrarily set to 100 µA. Now, to allow the largest possible range of measurements, set $t_c$=(Δ$V_{min}$)($C_{max}$)/$I_{REF}$. For this example, $t_c$=(1 mV)(50,000 µF)/(100 µA)=0.5 second (or 500 mS).

Having thus determined $t_c$, the largest range of measurable capacitance values will be available when $t_d$=∞, and therefore the absolute low limit of this range of capacitance values is $C_{LowLim}$=(Δ$V_{min}$)($C_{max}$)/$V_{max}$, where $V_{max}$ is assumed to be 1 V. The minimum measurable capacitance value calculated using this equation is possible only when $t_d$=∞. As the value of $t_d$ is reduced to something more practical, the minimum measurable capacitance value increases. This relationship is described by the following equation:

$$t_d = \left(-\frac{C_{min}}{C_{LowLim}}\right)\left(\ln\left(1-\frac{C_{LowLim}}{C_{min}}\right)\right)\cdot\frac{iR}{V_{PK(+)}}\cdot t_c \quad (5)$$

In this example, with $\Delta V_{min}$=1 mV and $V_{max}$=1V as set forth hereinabove, $C_{LowLim}$=50 µF. But, again, this assumes that $t_d$=∞. By setting the minimum capacitance value $C_{min}$ at 55 µF (a factor 1.1 greater than the absolute low limit), the discharge time may be calculated by substituting the following values into equation (5): $V_{PK(+)}$=1V, i=$I_{REF}$=100 µA, Vmax=1V, R=5000 ohms, and $t_c$=0.5 seconds. Discharge time, then, is $t_d$=(2.63) (0.0001 amps)(5000 ohms)(0.5 seconds)/1 V=0.66 seconds.

Total measurement time is $t_c$+$t_d$, or 1.16 seconds to measure any capacitance value between 55 µF and 50,000 µF. The capacitance range can be extended to 50 µF by lengthening the discharge time $t_d$ to infinity. Alternatively, $t_d$ can be reduced to 0.25 second if the capacitance range is reduced to include only the value of 50,000 µF. Obviously, neither of these extremes is practical, and the value computed in the foregoing example is a very good compromise.

As pointed out above, another consideration in choosing incremental charge and discharge times $t_c$ and $t_d$, respectively, is that their sum dictates how long a user must wait before a capacitance measurement is available.

An interesting phenomenon is that regardless of the state of charge of capacitor 10 when measurement and control circuit 18 begins operating, charging and discharging capacitor 10 by operation of switches 12a and 12b for the incremental time intervals $t_c$ and $t_d$, the equilibrium voltage will be arrived at within a few cycles of charge and discharge. For all practical purposes, then, measurement can begin as soon as the peak-to-peak voltage for the charge ramp is within the ADC's operating range. The peak-to-peak voltage is, of course, the value ΔV needed for capacitance calculation, and the interval $t_c$ is Δt. While one charge-discharge cycle is sufficient for obtaining a ΔV measurement, it should be noted that in some cases where increased accuracy is desired and speed is not important, particularly for measuring large capacitors, the peak-to-peak voltage may be summed over several charge cycles to produce the value ΔV for measurement purposes, while the intervals $t_c$ are likewise summed to produce Δt. Capacitance may be calculated from the equation C=$I_{REF}$Δt/ΔV as described earlier.

For practical applications, FIG. 8 shows a table of typical values for fast measurement of a wide range of capacitance values. Four ranges are shown. For each of these ranges, typical values of ADC resolution and number of digits, $I_{REF}$, $t_c$, $t_d$, optimal discharge time and capacitance limits are given. Resistance R, not shown in the table, is 5000 ohms.

Of course, once charge time $t_c$ is determined, and peak-to-peak incremental voltage ΔV is measured by the ADC, the value of unknown capacitance may be calculated from equation (1) because the value of $I_{REF}$ is also known. Thus, C=$I_{REF}$$t_c$/ΔV.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A method for measuring capacitance, comprising:

charging a capacitor at a linear rate by applying a predetermined constant current thereto, and discharging said capacitor at an exponential rate;

selecting a charge time and a discharge time for said capacitor such that a first incremental voltage developed from a first peak voltage to a second peak voltage during said charge time and a second incremental voltage developed from said second peak voltage to said first peak voltage during said discharge time are equal, said first and second incremental voltages being within the range of a measurement analog-to-digital converter;

measuring said first incremental voltage; and calculating a capacitance value by multiplying said predetermined constant current by said charge time and dividing by said first incremental voltage.

2. A method for measuring capacitance in accordance with claim 1, wherein said charge time is small compared with discharge time constant of said capacitor.

\* \* \* \* \*